US006937179B1

(12) United States Patent
Martin

(10) Patent No.: US 6,937,179 B1
(45) Date of Patent: Aug. 30, 2005

(54) RESISTOR TUNING NETWORK AND METHOD FOR TUNING A RESISTOR IN AN ELECTRONIC CIRCUIT

(75) Inventor: Brian C. Martin, Carlsbad, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 76 days.

(21) Appl. No.: 10/442,009

(22) Filed: May 20, 2003

Related U.S. Application Data

(63) Continuation-in-part of application No. 09/778,540, filed on Feb. 7, 2001, now Pat. No. 6,573,811.

(51) Int. Cl.[7] .................................................. H03M 1/78
(52) U.S. Cl. ......................... 341/154; 341/144; 341/155
(58) Field of Search ................................. 341/154, 144, 341/155, 136

(56) References Cited

U.S. PATENT DOCUMENTS

| | | | |
|---|---|---|---|
| 4,260,968 A | | 4/1981 | Haigh et al. |
| 4,302,746 A | | 11/1981 | Scarzello et al. |
| 4,323,885 A | | 4/1982 | Carriere et al. |
| 4,422,048 A | | 12/1983 | Edwards |
| 4,467,286 A | | 8/1984 | Stitt |
| 4,791,379 A | | 12/1988 | Hughes |
| 4,843,394 A | | 6/1989 | Linz et al. |
| 4,864,304 A | | 9/1989 | Shigehara et al. |
| 5,043,731 A | | 8/1991 | Nishimura |
| 5,126,740 A | * | 6/1992 | Kawada ....................... 341/154 |
| 5,455,582 A | | 10/1995 | Valdenaire |
| 5,473,278 A | | 12/1995 | Shibata |
| 5,534,862 A | * | 7/1996 | Gross et al. ................. 341/154 |
| 5,592,116 A | | 1/1997 | Bedouani |
| 5,729,231 A | * | 3/1998 | Kikuchi ....................... 341/154 |
| 5,841,329 A | | 11/1998 | Dutilleul |
| 6,380,877 B2 | * | 4/2002 | Castaneda et al. .......... 341/154 |
| 6,573,811 B2 | * | 6/2003 | Martin ......................... 333/172 |
| 6,633,246 B1 | * | 10/2003 | Bowers ....................... 341/144 |

OTHER PUBLICATIONS

Alzaher, H.A., et al.; "Digitally Tuned Analogue Integrated Filters Using R–2R Ladder"; Electronics Letters; Jul. 20th, 2000; vol. 36, No. 15; pp. 1278–1280.

* cited by examiner

*Primary Examiner*—Michael Tokar
*Assistant Examiner*—Lam T. Mai

(57) ABSTRACT

A resistor tuning network is disclosed that comprises a first resistor connected in parallel with a second variable resistor and a third resistor coupled in series with the first resistor and the second variable resistor. The second variable resistor comprises an R-2R ladder network having an input and first and second output terminals, with a first line having a plurality of first arms connected in series with the input and first output terminal and nodes between each pair of arms, each arm having an identical resistor R. A series of shunt arms, each with a 2R resistor and a switch, are selectively connected between the respective nodes and the first or second output terminal. The resistance of the resistor tuning network is tuned by varying the switch positions in the shunt arms in the R-2R ladder network.

22 Claims, 4 Drawing Sheets

RESISTOR TUNING NETWORK AND METHOD FOR TUNING A RESISTOR IN AN ELECTRONIC CIRCUIT

CROSS-REFERENCE TO RELATED APPLICATIONS

This patent application is related to and claims priority as a continuation-in-part of U.S. patent application Ser. No. 09/778,540 filed on Feb. 7, 2001 which is now U.S. Pat. No 6,573,811 for "RESISTOR TUNING NETWORK AND METHOD FOR MICROELECTRONIC RC-BASED FILTERS."

The present invention is also related to that disclosed in U.S. patent application Ser. No. 09/934,158 filed Aug. 21, 2001, entitled "EFFICIENT IMPLEMENTATION OP A COMPLEX FILTER WITH ON-CHIP RESISTOR TUNING;"

The above applications are commonly assigned to the assignee of the present invention. The disclosures of these related patent applications are hereby incorporated by reference for all purposes as it fully set forth herein.

TECHNICAL FIELD OF THE INVENTION

The present invention relates generally to the tuning of a resistor in an electronic circuit, and, in particular, to the tuning of a resistor in an on-chip, microelectronic component such as an RC filter.

BACKGROUND OF THE INVENTION

Filtering is a fundamental signal processing tool used in almost all electronic systems. While some filtering functions can be performed in the digital domain, filtering in the analog domain is essential in countless applications where only analog techniques enable high-speed processing of small signal levels with the required resolution. Front-end processing in almost all electronic systems such as wireless and wireline communications, video, audio, imaging, etc. rely heavily on filtering in the analog domain.

We have been witnessing in the last several decades that the cost and footprint of electronic systems are scaling down significantly as increasingly more functionality is integrated on a single chip of semiconductor. While microchip processing is extremely efficient in building a large number of devices on a microchip, analog processing still suffers from variations in component values from one fabrication run to another. Further limitations to analog processing accuracy come from the dependence of component parameters on temperature, which is becoming more and more costly to control as a result of larger scale integration. A widely recognized solution to this problem is the tuning of on-chip components until the error due to component variations becomes negligible.

In a typical RC filter composed of amplifiers, resistors and capacitors, the accuracy of the filter transfer function is determined by the resistor and capacitor values. In general, either resistors or capacitors can be tuned to obtain the required overall transfer function. Tuning can be performed efficiently by switching small-valued components in or out of the circuit. As the dominant non-ideality of a reasonably-sized micro-switch is its parasitic resistance (up to very high frequencies), tuning of capacitors poses a difficulty as a result of an undesired resistance appearing in series with the capacitor to be tuned. Tuning of resistors, therefore, can be more effective in many realizations.

FIG. 1 illustrates an exemplary low pass filter 100. Low pass filter 100 may be tuned by adjusting the value of the resistor components. Low pass filter 100 comprises operational amplifier 120 having an input resistor R1 coupled to the inverting input of operational amplifier 120. Resistor R2 and capacitor C are coupled in parallel with operational amplifier 120 as shown in FIG. 1. As is well known in the art, the transfer function of low pass filter 100 is given by the expression:

$$\frac{V_{out}}{V_{in}} = \frac{-R2}{R1}\left(\frac{1}{1+sCR2}\right) \quad (1)$$

As the value of resistor R2 and the value of capacitor C are varied, the value of the pole of the filter (equal to the reciprocal of CR2) also varies.

If the resistor R2 is tunable, then the value of resistor R2 can be adjusted to compensate for process variations of both R2 and C. For example, if the value of capacitor C was twenty percent (20%) below its nominal value, then the value of resistor R2 could be tuned to twenty five percent (25%) above its nominal value in order to compensate. That is, (0.80 C nominal) (1.25 R2 nominal)=(1.00) (CR2 nominal).

However, in order to keep the gain constant, resistor R1 would also have to be tuned in the same way as resistor R2. Otherwise, the value of the gain term (−R2/R1) would not remain constant. It is therefore desirable to tune both resistor R1 and resistor R2 in a manner that ensures that their matching remains good. In more complicated filters, additional resistors would also need to be tuned. It is desirable that the respective ratios of such resistors also remain constant.

FIG. 2 illustrates a conventional prior art circuit 200l for tuning a resistor by switching in or out some small-valued resistors that are in series with the resistor to be tuned ($R_{TUNE}$). Switches S in circuit 200 are closed and opened to include more or less resistance $R_X$ in series with the resistance to be tuned. When fine tuning is desired, the switched resistors need to be much smaller than the resistor to be tuned, typically on the order of one hundredth (0.01) or less. This necessarily requires large size switches, such that the parasitic switch resistance can be neglected next to the tuning resistors.

A typical example is a five thousand ohm (5 kΩ) resistor to be tuned to below one percent (1%) precision. This requires tuning resistors that are less than fifty ohms (50 Ω), which in turn requires a switch resistance on the order of ten ohms (10 Ω) or less. A switch with such a low on resistance requires a transistor that is several hundred times larger than a minimum geometry device. Note that, increased switch size, besides requiring more chip real estate, also exhibits higher parasitic capacitance along the signal path, and increased noise coupling through the substrate. The large spread of resistor values also limits the accuracy and matching between resistors. Small-valued resistors also require much more hand-tailoring in layout, as their aspect ratios turn out to be awkward, and parasitic contact resistances introduce considerable error to the overall resistance. Another difficulty is that different tuning resistor values are needed for each different resistor value to be tuned (so that the same relative accuracy can be maintained across all resistors). For example, fifty ohm (50 Ω) resistors are needed to tune a five thousand ohm (5 kΩ) resistance, whereas seventy five ohm (75 Ω) resistors would be needed to tune a seven thousand five hundred ohm (7.5 kΩ) resistor with the same relative increments.

There is therefore a need in the art for an improved apparatus and method for tuning a resistor in an electronic circuit. In particular, there is a need in the art for an improved apparatus and method for tuning a resistor in an on-chip, microelectronic component such as an RC filter.

SUMMARY OF THE INVENTION

To address the above-discussed deficiencies of the prior art, it is a primary object of the present invention to provide a new and improved resistor tuning network that is particularly suitable for tuning microchip integrated resistors.

According to one advantageous embodiment of the present invention, a resistor tuning network is provided that is capable of operating as a tunable resistor by providing variable output values of resistance. The resistor tuning network comprises a first resistor having a fixed value of resistance R1 coupled in parallel with a resistor ladder network having a variable value of resistance R2. The resistor ladder network has an input and first and second output terminals, and a plurality of arms connected in series with the input and first output terminal, with each arm having a resistor R and a node separating each pair of adjacent arms, a shunt arm connected to each node, each shunt arm having a resistor which has a value which is a multiple of R and a switch in series, each switch having a first, closed position connecting the shunt arm to the first output terminal and a second, open position connecting the shunt arm to the second output terminal, such that the resistance of the ladder network may be varied depending upon how the switches are set. The resistance of the resistor ladder network is at a minimum value when all the switches are closed. The resistance of the resistor ladder network is at a maximum value when all the switches are open. The switch positions in the resistor ladder network can be varied in order to provide a plurality of values of output resistance for the resistor ladder network.

A third resistor having a fixed value of resistance R3 is connected in series with the parallel connected first resistor and the resistor ladder network.

This arrangement produces a resistor tuning network that exhibits good linearity in the resistor values with the switch positions, allowing the fine tuning of a large spread of resistor values. The resistor ladder network may be an R-2R ladder network. Because the switches in the R-2R ladder network are all in series with the same amount of resistance, i.e., 2R, they can be uniformly sized. In an advantageous embodiment of the invention, 2R is on the order of at least one thousand ohms (1 kilohm), so that the switch sizes can be kept small and so that the switch induced non-linearities can be kept negligible. Thus, this arrangement permits an effective resistor tuning network for an RC filter to be integrated on a single microchip.

In one advantageous embodiment of the invention, the equivalent resistance REQ of the resistor tuning network is given by the following relationship:

$$REQ = \frac{1 + R3\left(\frac{1}{R1} + \frac{1}{R2}\right)}{\frac{1}{R1} + \frac{1}{b}\left(\frac{1}{R2}\right)} \quad (2)$$

where R1 is the value of resistance of the first resistor that is connected in parallel with the R-2R ladder network, R2 is the value of resistance of the R-2R ladder network, which is varied according to the number of switches that are closed, R3 is the value of resistance of the third resistor coupled in series with the parallel connected first resistor and R-2R ladder network, and the letter "b" is a parameter that represents the status of the switch positions. Depending upon how many switches are closed, the value of the switch parameter "b" varies from one (1) (when all the switches are closed) to two to the "n"th power ($2^n$) (when all of the switches are open). The letter "n" represents the total number of branch lines or switches in the resistor ladder network.

According to another advantageous embodiment of the present invention, a method of operating a resistor tuning network as a tunable resistor is provided, which comprises the steps of:

providing a first resistor having a fixed value of resistance R1; and providing a resistor ladder network that comprises an R-xR ladder, where xR is a multiple of R, where R is the value of resistance of resistor R in the resistor ladder network, where the resistor ladder network has a variable value of resistance R2; and connecting the resistor ladder network in parallel with the first resistor; varying the resistance of the R-xR ladder network by selectively opening and closing switches connected in xR branches of the R-xR ladder network to connect lesser or greater numbers of the xR branches to an output terminal of the R-xR ladder network in order to create a desired tuned resistance value of the R-xR resistor ladder network; and connecting an input of the R-xR ladder network in series with a third resistor of said resistor tuning network, where the third resistor has a fixed resistance R3; and varying the switch positions in the resistor ladder network to provide variable output values of resistance for the resistor tuning network.

In one advantageous embodiment of the present invention, the resistor tuning network is integrated on a microchip on which an RC filter is built. In another advantageous embodiment of the present invention, the R-xR ladder network is an R-2R ladder network. By connecting a resistance in parallel with an R-2R ladder network, a resistor tuning network is provided that has good linearity in its tuning transfer function and allows a large spread of resistor values. With this arrangement, high tuning accuracy is achieved with a small spread in resistor values. Because the switches in the R-2R ladder are all in series with the same amount of resistance (i.e., 2R), they can be uniformly sized. By selecting 2R to be of the order of one thousand ohms (1 kilohm) or more, switch sizes can be made small, enabling the network to be integrated into a microelectronic chip or silicon chip.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, it not most instances, such definitions apply to prior uses, as well as to future uses, of defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
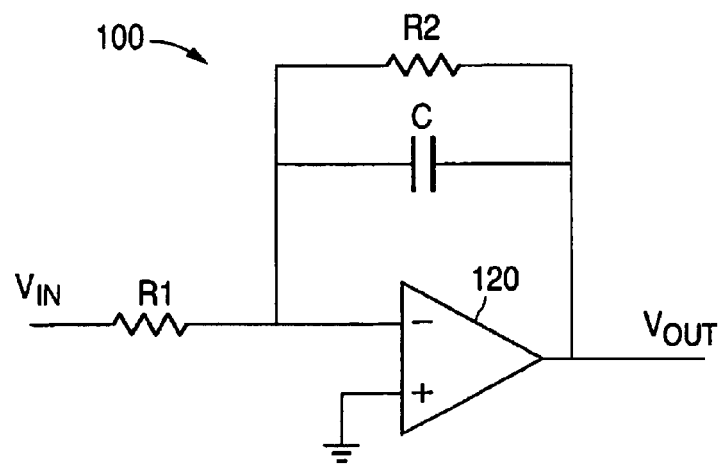
FIG. 1 is a schematic diagram illustrating a prior art low pass filter circuit.
Figure 2:
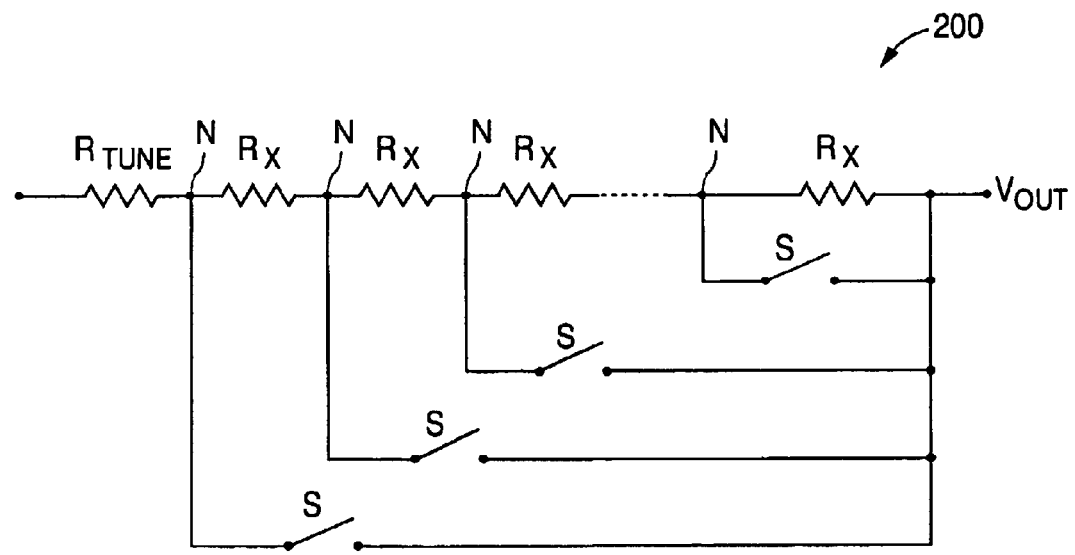
FIG. 2 is a schematic diagram illustrating a prior art resistor tuning network.

FIG. 2 illustrates a prior art resistor tuning network 200 in which a plurality of identical resistors $R_X$ are connected in series with a resistor to be tuned ($R_{TUNE}$). A branch line is connected between each node N of the network and the output $V_{OUT}$, with a switch S in each branch line for controlling its connection in the circuit. Switches S are opened or closed to provide more or less resistance in series with the resistance to be tuned. When fine tuning is desired, the switched resistors have to be much smaller than the resistor to be tuned, typically on the order of one hundredth (0.01) or less. This necessarily requires larger size switches so that the parasitic resistance can be neglected next to the tuning resistors $R_X$. Increased switch size in turn increases the area required for the tuning network, and typically makes it too large for incorporation on a single microelectronic chip.

Figure 3:
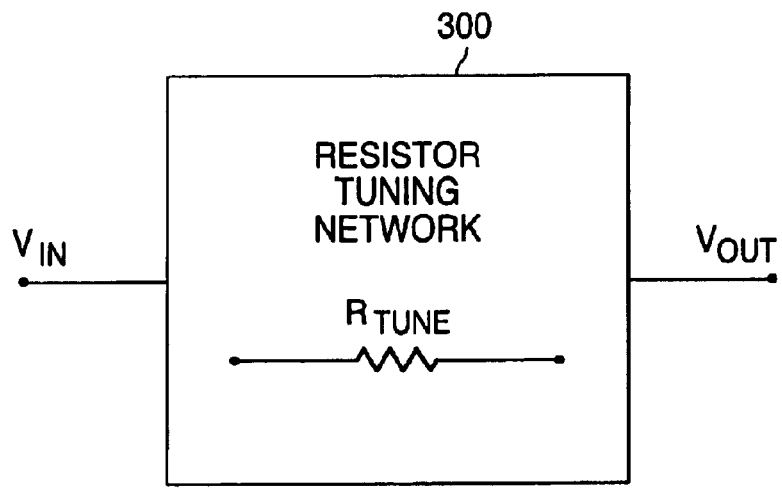
FIG. 3 is a schematic diagram illustrating that a resistor tuning network of the present invention may be comprise a tunable resistor ($R_{TUNE}$)

FIG. 3 illustrates a resistor tuning network 300 according to an advantageous embodiment of the present invention. Resistor tuning network 300 comprises a circuit that is capable of being operated as a tunable resistor (denoted $R_{TUNE}$. The input voltage of resistor tuning network 300 is denoted $V_{IN}$ and the output voltage of resistor tuning network 300 is denoted $V_{OUT}$. The variable values of resistor tuning network 300 represent possible resistor values for tunable resistor $R_{TUNE}$.

Figure 4:
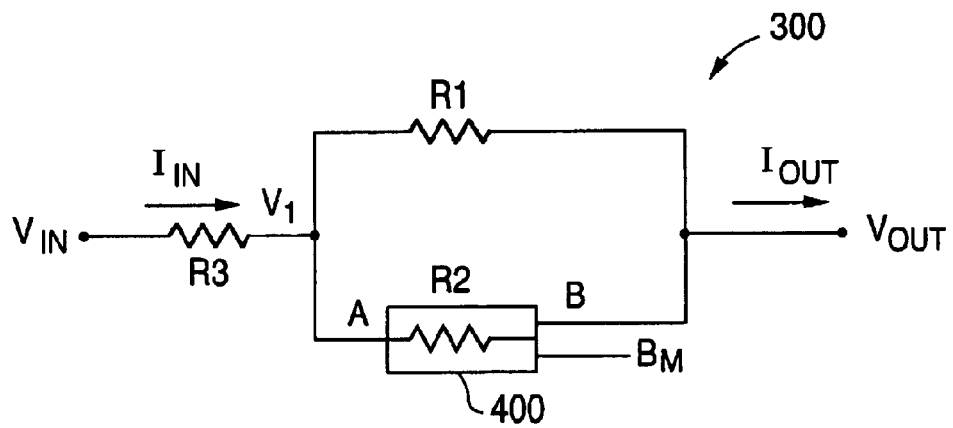
FIG. 4 is a schematic diagram illustrating a more detailed view of the resistor tuning network of the present invention shown in FIG. 3.

FIG. 4 illustrates resistor tuning network 300 according to an advantageous embodiment of the present invention in which the components can be of relatively small size suitable for integration on a semiconductor chip for tuning an on-chip resistor, particularly a resistor forming part of an RC filter. As illustrated in FIG. 4, a resistor R3 (having a fixed value of resistance R3) is connected in series with a resistor R1 (having a fixed value of resistance R1). A resistor R2 (having a variable value of resistance R2) is connected in parallel with resistor R1. Resistor tuning network 300 has an input voltage $V_{IN}$, an input current $I_{IN}$ through resistor R3, and an output voltage $V_{OUT}$ and current $I_{OUT}$. The variable resistor R2 comprises an R-2R ladder network 400, as illustrated in detail in FIG. 5, and has an input terminal A, an output terminal B, and a second output terminal $B_M$.

Figure 5:
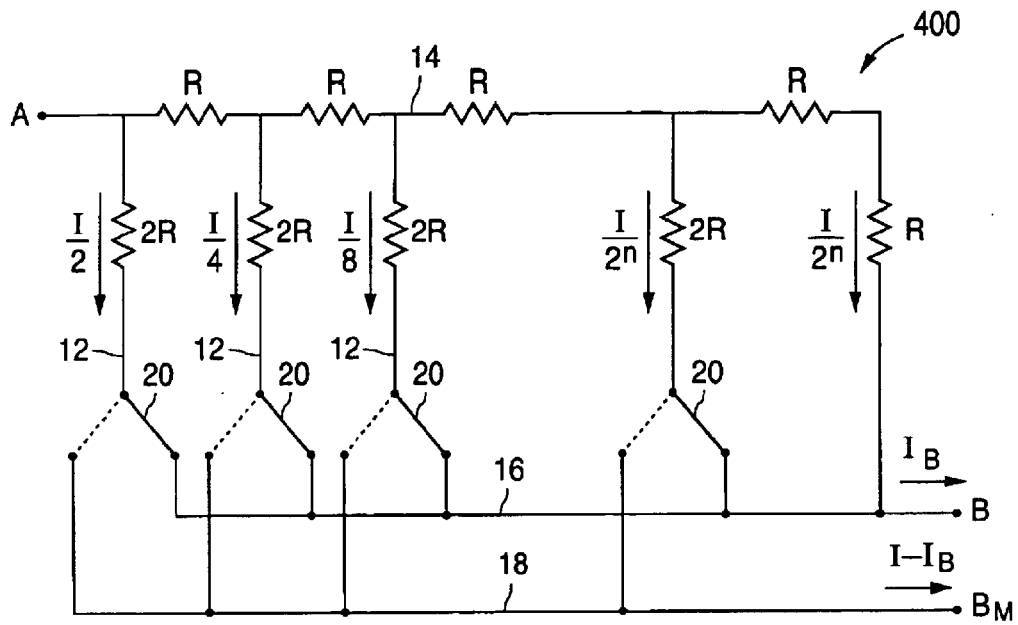
FIG. 5 is a schematic diagram illustrating an R-2R ladder network representing resistor R2 in the resistor tuning network of the present invention shown in FIG. 4.

As illustrated in FIG. 5, R-2R ladder network 400 has a series of resistors R of constant resistance connected in series between input node A and output node B. A series of branch or shunt lines 12 are connected between input line 14 and either output line 16 which connects to terminal B or output line 18 which connects to terminal $B_M$, dependent upon the position of a switch 20 positioned in each line 12. A resistor 2R having a resistance twice that of resistor R is connected in each shunt line 12. In this ladder, the output current at node B, designated $I_B$, is given by:

$$I_B = \frac{V_A}{R} b \qquad (3)$$

where the letter "b" is a parameter that represents the switch positions. Depending upon how many switches are closed, the value of the switch parameter "b" varies from one (1) (when all the switches are closed) to two to the "n"th power ($2^n$) (when all of the switches are open). The letter "n" represents the total number of branch lines or switches. $V_A$ represents the voltage at node A. Equation (3) assumes that the voltages at the terminals B and $B_M$ are at ground relative to the voltage $V_A$.

Ladder network 400 exhibits constant resistance R with respect to the input terminal A, but the currents coming out of terminals B and $B_M$ depend on the position of the switches. When all switches are closed, as illustrated in solid line in FIG. 5, total current of the R-2R ladder network 400 is observed at the B terminal. As the switches are opened, into the dotted line position, the currents (in the vertical branches 12 of the ladder network 400) are stolen from the B terminal and delivered to the $B_M$ terminal. Note that, for proper operation, the B and $B_M$ points of the ladder network 400 must be at the same potential, a requirement that can be easily satisfied in many configurations. Tuning of the overall resistance of the ladder network 400 shown in FIG. 5 can therefore be realized by controlling the switches of the R-2R ladder.

Figure 6:
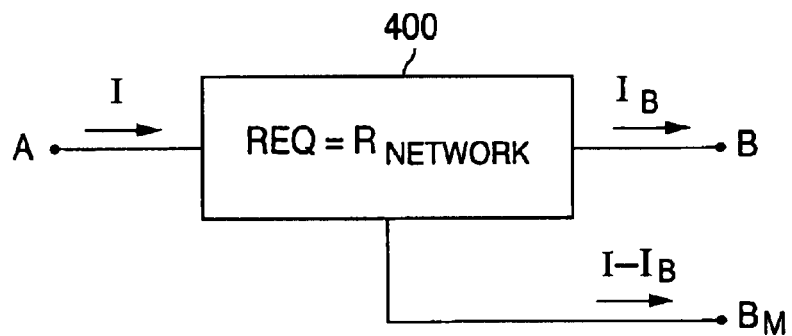
FIG. 6 is a schematic diagram illustrating the resistor tuning network shown in FIG. 5 illustrating the equivalent resistance REQ of the network and illustrating the input currents and output currents of the network.

FIG. 6 is a schematic diagram illustrating the ladder network 400 shown in FIG. 5. The equivalent resistance of ladder network 400 is designated REQ. The input current to ladder network 400 is designated I. The output current to terminal B is designated $I_B$. The output current to terminal $B_M$ is designated $(I-I_B)$. Note that the value of input current I to ladder network 400 is not the same as the input current $I_{IN}$.

As previously mentioned, when all the switches are closed in ladder network 400, the value of the switch parameter "b" equals one (1). On the other hand, when all the switches are open, the value of "b" equals two to the "n"th power ($2_n$) (because now, only the right most branch's current is available to terminal B). The letter "n" represents the binary depth of the ladder, which is equal to the number of vertical branches, and also to the number of switches in the ladder. The minimum and maximum resistances that can be obtained from the ladder are equal to R and $2_nR$, respectively.

For fine tuning of resistors at different values, the non-linearity of this transfer curve poses severe difficulties. Tuning accuracy with respect to minimum switch steps becomes smaller and smaller as the equivalent resistor value increases. The linearity of the curve can be improved significantly by adding a resistance in parallel with the R-2R ladder. This is the purpose of the resistor R1 shown in FIG. 4.

The transfer function of resistor tuning network 300 shown in FIG. 4 is derived below. For simplicity, assume that $V_{OUT}$ is at virtual ground, i.e., $V_{OUT}$ equals zero volts.

$$I_{OUT} = \frac{V_1}{bR2} + \frac{V_1}{R1} \quad (4)$$

$$\frac{I_{OUT}}{V_1} = \frac{1}{bR2} + \frac{1}{R1} \quad (5)$$

$$\frac{I_{OUT}}{V_1} = \frac{R1 + b\,R2}{bR2R1} \quad (6)$$

$$\frac{V_1}{I_{OUT}} = \frac{b\,R2\,R1}{R1 + bR2} \quad (7)$$

The standard notation for two resistances, R1 and R2, that are coupled in parallel is R1∥R2. This notation represents the value $$\left(\frac{1}{R1} + \frac{1}{R2}\right)^{-1}.$$

The relationship between $V_1$ and $V_{IN}$ is then:

$$V_1 = \left(\frac{R1\|R2}{R1\|R2 + R3}\right)V_{IN} \quad (8)$$

$$V_{IN} = \left(\frac{R3 + R1\|R2}{R1\|R2}\right)V_1 \quad (9)$$

Combining this expression with Equation 7 enables one to find the transfer function of resistor tuning network 300. Remember that $V_{OUT}$ has arbitrarily been set to zero.

$$\frac{V_{IN}}{I_{OUT}} = REQ = \left(\frac{R3 + R1\|R2}{R1\|R2}\right)\left(\frac{R2\,R1}{\left(\frac{1}{b}\right)R1 + R2}\right) \quad (10)$$

Note that Equation 10 is mathematically equivalent to Equation 2.

The series resistor R3 does not add to the parallel combination of R1 and R2 as one would expect. Instead, the series resistor R3 creates a multiplicative term to the transfer function. This is not obvious because $$\frac{V_{IN}}{I_{IN}} = R3 + R1\|R2 \quad (11)$$

which is what one would normally expect and normally think of as the resistance. In the case of a tunable resistor network the ratio of $V_{IN}$ to $I_{OUT}$ is what counts and not the ratio of $V_{IN}$ to $I_{IN}$. Although the circuit shown in FIG. 4 is a tunable resistor network the term "tunable resistor network" may be somewhat misleading. What is really being tuned is the current $I_{OUT}$, or rather the transfer function represented by the ratio of $V_{IN}$ to $I_{OUT}$ (with $V_{OUT}$ set equal to zero). In the case of the filter example, tuning the transfer function is effectively the same as tuning the resistor.

In designing an appropriate filter, first the value of the smallest resistor that is needed is calculated. The tunable network is then created where the value of resistor R3 is zero and the values of resistors R1 and R2 are chosen to give (1) the correct value of the smallest resistor needed, and (2) the desired tuning tolerance. All the other resistors are created using the same R1 and R2 network. The value of resistor R3 is then chosen to give the larger values. Because resistor R3 modifies a multiplicative term (i.e., the first factor to the right of the second equal sign in Equation 10) the tuning variable "b" adjusts the overall transfer function by the same percentage. This is significant because it allows all the resistors to track in ratio, even though the absolute values are different.

The present invention allows one to tune the tunable resistor network with one control (e.g., a single knob) and move all of the different resistors by the same percentage at the same time. This feature maintains the resistor ratios. The present invention also allows one to tune out capacitive and resistor variation while maintaining the same transfer function.

Now choose some exemplary values for resistor R1 and for resistor R2. For example, choose R1=2.0 kilohm and R2=2.0 kilohm. Using these values in Equation 10 above results in:

$$REQ = \frac{2(1 + R3)}{1 + b^{-1}} \quad (12)$$

where the letter "b" represents the switch parameter that varies between a value of one (1) and a value of two to the "n"th power ($2^n$) with unit increments. For fine tuning, large values of "b" are used.

EXAMPLE ONE

Figure 7:
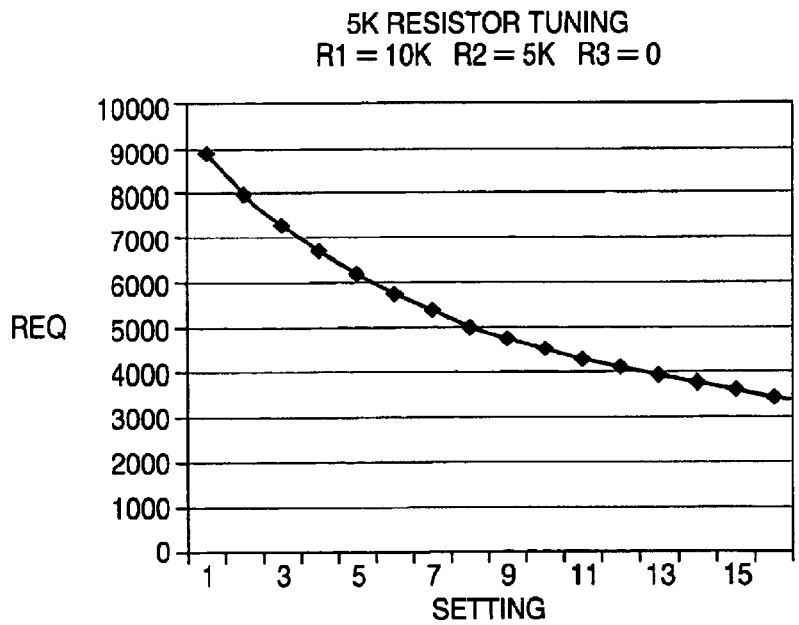
FIG. 7 illustrates a graph of a first example of tuning of an equivalent resistor value variation of the resistor tuning network of the present invention when tuning a five thousand ohm (5.0 kilohm) resistor.

FIG. 7 illustrates a first example of tuning of an equivalent resistor value (REQ) variation of resistor tuning network 300 of the present invention. Assume that a resistor $R_{TUNE}$ needs to be provided that has resistor values tuned to values within five percent (5%) of a five thousand ohm resistor (5.0 kilohms) over an expected process variation of plus or minus forty percent (±40%). The value of resistor R1 is chosen to be ten thousand ohms (10.0 kilohms) and the value of resistor R2 is chosen to be five thousand ohms (5.0 kilohms). The value of series resistor R3 is chosen to be zero ohms (0.0 ohms).

The value of resistor R2 is chosen to be a four (4) bit R-2R ladder network. That is, the value "n" in the R-2R ladder network is chosen to be four (4). In the case of a five thousand ohm resistor (5.0 kilohms), a binary setting of "1000" for the four switches in the R-2R ladder network provides an equivalent resistance of five thousand ohms (5.0 kilohms). A binary setting of "1111" for the four switches in the R-2R ladder network provides a minimum equivalent resistance of three thousand three hundred thirty three ohms (3.333 kilohms). A binary setting of "0000" for the four switches in the R-2R ladder network provides a maximum equivalent resistance of eight thousand eight hundred eighty eight ohms (8.888 kilohms).

FIG. 7 illustrates a chart showing the values of the equivalent resistor values (REQ) plotted versus a "setting" parameter. The setting parameter is related to the switch parameter "b" for the R-2R ladder network as follows:

$$b = 2_n / \text{setting} \quad (13)$$

The setting parameter is the n-bit binary value used to set the n switches in the R-2R ladder network. In the case of a four (4) bit ladder network, the values of the setting parameter range from one (1) to sixteen (16). The sixteen values of the equivalent resistor values (REQ) for the sixteen (16) values of setting are as follows:

TABLE ONE

| Setting | Value of REQ (Ohms) |
|---|---|
| 1 | 8888.888889 |
| 2 | 8000.000000 |
| 3 | 7272.727273 |
| 4 | 6666.666667 |
| 5 | 6153.846154 |
| 6 | 5714.285714 |
| 7 | 5333.333333 |
| 8 | 5000.000000 |
| 9 | 4705.882353 |
| 10 | 4444.444444 |
| 11 | 4210.526316 |
| 12 | 4000.000000 |
| 13 | 3809.523810 |
| 14 | 3636.363636 |
| 15 | 3478.26087 |
| 16 | 3333.333333 |

The minimum equivalent resistor value of 3333 ohms for the binary setting "1111" (setting "16") corresponds to a factor of 0.667. The factor of 0.667 will neutralize a process variation factor of 1.5 (or +50%). The maximum equivalent resistor value of 8888 ohms for the binary setting "0000" (setting "1") corresponds to a factor of 1.778. The factor of 1.778 will neutralize a process variation factor of 0.652 (or −43.8%).

To verify that resistor tuning network 300 can come within five percent (5%) of the desired tuning value, note that the difference in the process variation factors at the extreme ends of the range. On the high end, the binary setting of "1111" neutralizes a process variation factor of 1.5 and the binary setting of "1110" neutralizes a process variation factor of 1.438. The worst case would occur in the middle (i.e. 1.469) between the two factors. Either setting (i.e., "1111" or "1110") comes within five percent (5%). On the low end, the binary setting of "0000" neutralizes a process variation factor of 0.562 and the binary setting of "0001" neutralizes a process variation factor of 0.625. The worst case would occur in the middle (i.e., 0.594) between the two factors. Either setting (i.e., "0000" or "0001") comes within five percent (5%).

EXAMPLE TWO

Figure 8:
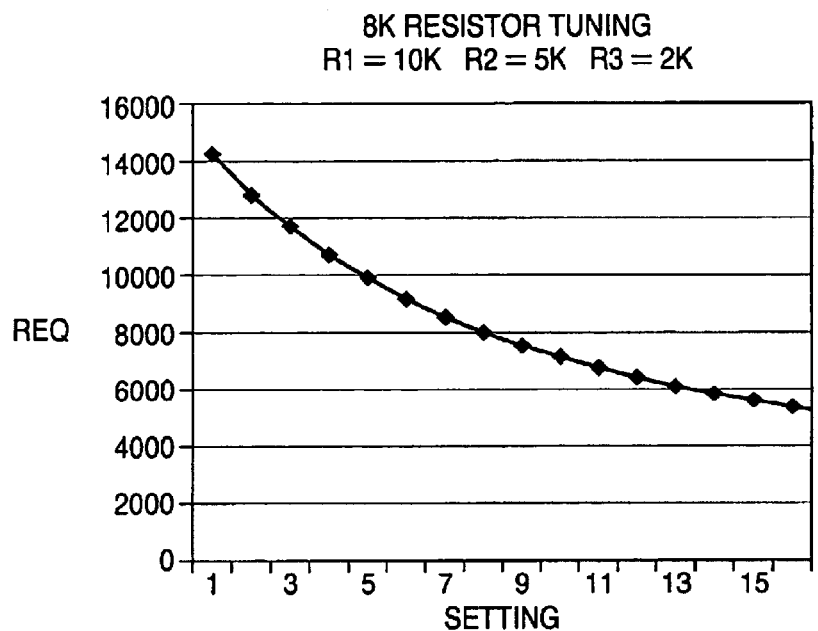
FIG. 8 illustrates a graph of a second example of tuning of an equivalent resistor value variation of the resistor tuning network of the present invention when tuning an eight thousand ohm (8.0 kilohm) resistor.

FIG. 8 illustrates a second example of tuning of an equivalent resistor value (REQ) variation of resistor tuning network 300 of the present invention. Assume that a resistor $R_{TUNE}$ needs to be provided that has resistor values tuned to values within five percent (5%) of an eight thousand ohm resistor (8.0 kilohms) over an expected process variation of plus or minus forty percent (±40%). The value of resistor R1 is chosen to be ten thousand ohms (10.0 kilohms) and the value of resistor R2 is chosen to be five thousand ohms (5.0 kilohms). The value of series resistor R3 is chosen to be two thousand ohms (2.0 kilohms).

The value of resistor R2 is chosen to be a four (4) bit R-2R ladder network. That is, the value "n" in the R-2R ladder network is chosen to be four (4). In the case of an eight thousand ohm resistor (8.0 kilohms), a binary setting of "1000" for the four switches in the R-2R ladder network provides an equivalent resistance of eight thousand ohms (8.0 kilohms). A binary setting of "1111" for the four switches in the R-2R ladder network provides a minimum equivalent resistance of five thousand three hundred thirty three ohms (5.333 kilohms). A binary setting of "0000" for the four switches in the R-2R ladder network provides a maximum equivalent resistance of fourteen thousand two hundred twenty two ohms (14.222 kilohms).

FIG. 8 illustrates a chart showing the values of the equivalent resistor values (REQ) plotted versus a "setting" parameter. The setting parameter is related to the switch parameter "b" for the R-2R ladder network as in the previous example. The setting parameter is the n-bit binary value used to set the n switches in the R-2R ladder network. In the case of a four (4) bit ladder network, the values of the setting parameter range from one (1) to sixteen (16). The sixteen values of the equivalent resistor values (REQ) for the sixteen (16) values of setting are as follows:

TABLE TWO

| Setting | Value of REQ (Ohms) |
|---|---|
| 1 | 14222.222222 |
| 2 | 12800.000000 |
| 3 | 11636.36364 |
| 4 | 10666.666667 |
| 5 | 9846.153846 |
| 6 | 9142.857143 |
| 7 | 8533.333333 |
| 8 | 8000.000000 |
| 9 | 7529.411765 |
| 10 | 7111.111111 |
| 11 | 6736.842105 |
| 12 | 6400.000000 |
| 13 | 6095.238095 |
| 14 | 5818.181818 |
| 15 | 5565.217391 |
| 16 | 5333.333333 |

The minimum equivalent resistor value of 5333 ohms for the binary setting "1111" (setting "16") corresponds to a factor of 0.667. The factor of 0.667 will neutralize a process variation factor of 1.5 (or +50%). The maximum equivalent resistor value of 14222 ohms for the binary setting "0000" (setting "1") corresponds to a factor of 1.778. The factor of 1.778 will neutralize a process variation factor of 0.652 (or −43.8%).

These values are the same values that were obtained in the case of the five thousand ohm (5.0 kilohm) resistor in the first example. Therefore, except for the different value for the R3 resistor, the five thousand ohm (5.0 kilohm) resistor and the eight thousand ohm (8.0 kilohm) resistor can be tuned identically with identical settings and resistor networks.

The resistor tuning network 300 of the present invention has many advantages over prior art tuning methods that involve switching a series of small value resistors into or out of a series connection with a resistor to be tuned. First, because the switches in ladder network 400 are each in series with the same amount of resistance (i.e., 2R), they can be uniformly sized. By selecting 2R to be of the order of one thousand ohms (1 kilohm) or more, the switch sizes can be kept small, allowing the overall network to be kept small enough so that the overall network can be readily integrated in a microchip.

As previously mentioned, because resistor R3 modifies a multiplicative term (i,e., the first factor to the right of the second equal sign in Equation 10) the tuning variable "b" adjusts the overall transfer function by the same percentage. After the third resistor R3 has been selected for a given resistor implementation, there is no need to calculate tuning resistor values. This arrangement allows resistor R3 to be selected depending on the overall range required for the equivalent resistance REQ, while control of resistor ladder network 400 allows the fine tuning of REQ. Although resistor ladder network 400 is shown as an R-2R ladder, other types of ladder networks having branch resistors that are different multiples of R may alternatively be used. For optimum results, the resistance in each branch should be the same, so that the switches can be uniformly sized.

By providing a first resistor with a fixed resistance R1 in parallel with an R-2R resistor ladder network 400, the tuning transfer function can be made more linear, allowing fine tuning of a large spread of resistor values with the same basic circuit. High tuning accuracy is achieved with a small spread in resistor values. If desired, all resistors in the network, including the resistors in R-2R resistor ladder network 400, can be built out of the same unitary resistors. This simplifies the circuit design and improves tracking and matching properties of microchip resistors.

Figure 9:
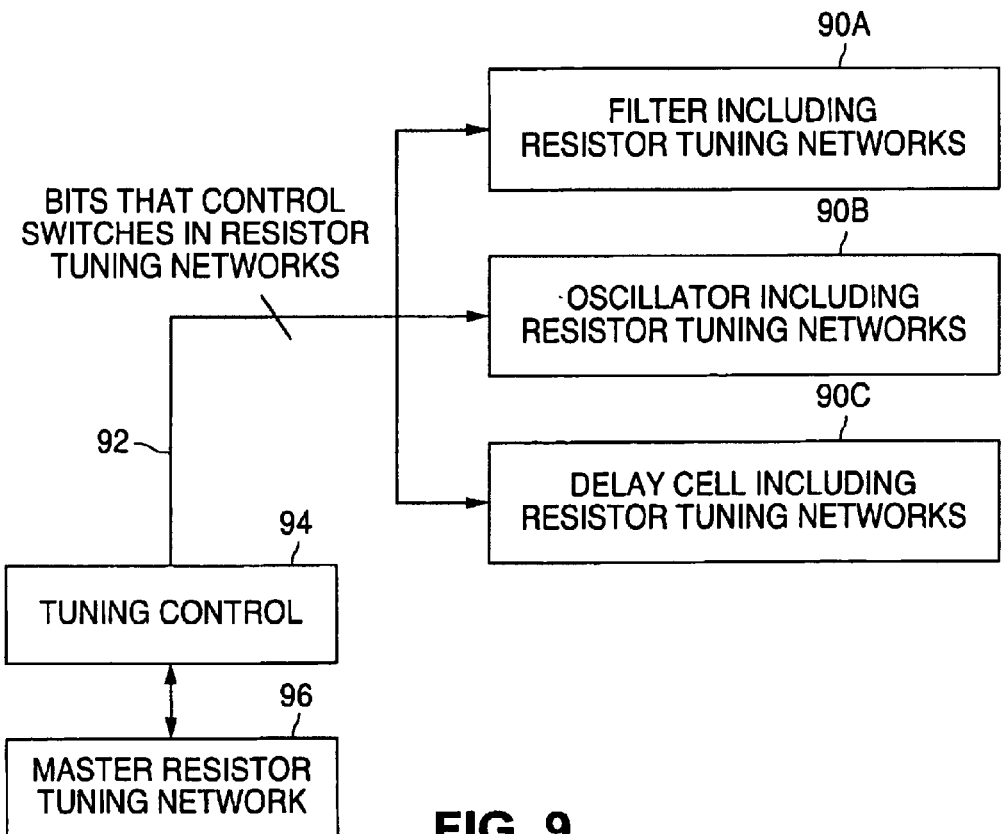
FIG. 9 illustrates a schematic tuning block diagram illustrating the tuning of individual integrated circuit component blocks using a common tuning control block.

In this arrangement, all resistors to be tuned can use the same R-2R resistor ladder network 400, with the same resistor values and switch sizes. If the same control lines are used for the R-2R resistor ladder network 400 for all of the resistors, the resistors can be tuned by the same relative amount with respect to their nominal values, as illustrated schematically in FIG. 9. A plurality of different component blocks 90A, 90B, 90C, etc. within an integrated circuit (IC) each use resistor tuning networks that have the form of resistor tuning network 300. For example, block 90A comprises a filter, block 90B comprises an oscillator block, and block 90C comprises a delay cell block.

Each tuning network in each block 90A, 90B, 90C, etc. is tuned via a common control line 92 from a tuning control unit 94, with signal bits controlling the switches in the plurality of resistor tuning networks. The tuning control unit 94 determines the tuning control bits by observing the behavior of a master tuning network 96. This provides a strong advantage in the layout of the various elements as compared to the standard prior art layout schemes where any different valued resistor to be tuned requires its own set of tuning resistor values and switch sizes.

Although the present invention has been described in detail, those skilled in the art should understand that they can make various changes, substitutions and alterations herein without departing from the spirit and scope of the invention in its broadest form.

What is claimed is:

1. A resistor tuning network comprising:
a first resistor having a fixed value of resistance R1, said first resistor having an input and an output;
a resistor ladder network having a variable value of resistance R2, said resistor ladder network connected between the input and the output of the first resistor in parallel with the first resistor, said resistor ladder network having an input and first and second output terminals, said first output terminal of said resistor ladder network being connected to said output of said first resistor;
wherein said resistor ladder network comprises a first line comprising a plurality of first arms connected in series with the input of the resistor ladder network and the first output terminal of the resistor ladder network and nodes between each pair of arms, each arm having an identical resistor R, and a second line connected to said first output terminal of said resistor ladder network, and a third line connected to said second output terminal of said resistor ladder network;
a series of shunt arms, each shunt arm having a first end connected to a respective node and a second end, a resistor which has a value which is a multiple of R and a switch in series between the first and second end of each shunt arm, each switch having a first, closed position connecting the shunt arm to the second line and a second, open position connecting the shunt arm to the third line, such that the resistance of the resistor ladder network is varied dependent on the switch positions and is at a maximum value when all switches are open and at a minimum value when all switches are closed, whereby a resistance can be tuned by varying the switch positions in the resistor ladder network; and
a third resistor having a fixed value of resistance R3, said third resistor connected in series with the parallel connected first resistor and resistor ladder network;
wherein said resistor tuning network operates as a tunable resistor by providing variable output values of resistance when said switch positions in said resistor ladder network are varied.

2. The resistor tuning network as claimed in claim 1, wherein said resistor ladder network is an R-2R ladder, and the resistor tuning network has a transfer function represented by resistance REQ given by the following relationship:

$$\frac{V_{IN}}{I_{OUT}} = REQ = \left(\frac{R3 + R1\|R2}{R1\|R2}\right)\left(\frac{R2\ R1}{\left(\frac{1}{b}\right)R1 + R2}\right)$$

where $V_{IN}$ is the input voltage to the resistor tuning network, $I_{OUT}$ is the output voltage of the resistor tuning network, R1 is the value of resistance of the first resistor connected in parallel with the R-2R resistor ladder network, R2 is the resistance of the R-2R resistor ladder network, R3 is the value of resistance of the third resistance coupled in series with the parallel connected first resistor and resistor ladder network, and the letter b represents a tuning variable that represents a current switch position where the tuning variable b is equal to $2^n$ divided by a setting parameter, wherein the setting parameter varies between 1 and $2^n$ in unit increments where n is the total number of shunt arms.

3. The resistor tuning network as claimed in claim 1 wherein said resistor tuning network provides a tunable resistor in an electronic component on an integrated circuit chip.

4. The resistor tuning network as claimed in claim 3 wherein said electronic component comprises one of: an RC filter, an oscillator and a delay cell.

5. The resistor tuning network as claimed in claim 2 wherein said transfer function of said resistor tuning network is capable of being tuned by a control signal that is capable of selecting one of a plurality of said switch positions in said resistor ladder network of said resistor tuning network.

6. The resistor tuning network as claimed in claim 5 wherein said transfer function of said resistor tuning network maintains resistor ratios when said control signal tunes said transfer function of said resistor tuning network.

7. The resistor tuning network as claimed in claim 6 wherein said transfer function is capable of tuning out capacitative and resistor variations when said control signal tunes said transfer function of said resistor tuning network.

8. The resistor tuning network as claimed in claim 1 wherein said resistor tuning network provides a tunable resistor in a master resistor tuning network, wherein said master resistor tuning network is capable of providing at least one control signal to a plurality of electronic components on an integrated circuit chip, wherein each electronic component of said plurality of electronic components comprises a resistor tuning network capable of using said at least one control signal to provide a tunable resistor within said electronic component.

9. The resistor tuning network as claimed in claim 8 wherein an electronic component of said plurality of electronic components comprises one of: an RC filter, an oscillator and a delay cell.

10. The resistor tuning network as claimed in claim 3 wherein all resistors on said integrated circuit chip that are capable of being tuned are tuned using said R-2R resistor ladder network in said resistor tuning network.

11. The resistor tuning network as claimed in claim 1 wherein said resistor tuning network operates as a tunable resistor that provides variable output values of resistance of said tunable resistor that range from said value of resistance of said tunable resistor minus five percent of said value of resistance of said tunable resistor to said value of resistance of said tunable resistor plus five percent of said value of resistance of said tunable resistor.

12. A method of operating a resistor tuning network as a tunable resistor, said method comprising the steps of:
    providing a first resistor having a fixed value of resistance R1;
    providing a resistor ladder network that comprises an R-xR ladder, where xR is a multiple of R, where R is the value of resistance of resistor R in said resistor ladder network, said resistor ladder network having a variable value of resistance R2;
    connecting said resistor ladder network in parallel with said first resistor;
    varying the resistance of the R-xR ladder network by selectively opening and closing switches connected in xR branches of the R-xR ladder network to connect lesser or greater numbers of the xR branches to an output terminal of the R-xR ladder network in order to create a desired tuned resistance value of said R-xR resistor ladder network; and
    connecting an input of said R-xR ladder network in series with a third resistor of said resistor tuning network, said third resistor having a fixed resistance R3; and
    varying said switch positions in said resistor ladder network to provide variable output values of resistance for said resistor tuning network.

13. The method as claimed in claim 12 wherein said R-xR ladder network is an R-2R ladder network, and said resistor tuning network has a transfer function represented by resistance REQ given by the following relationship:

$$\frac{V_{IN}}{I_{OUT}} = REQ = \left(\frac{R3 + R1\|R2}{R1\|R2}\right)\left(\frac{R2\ R1}{\left(\frac{1}{b}\right)R1 + R2}\right)$$

where $V_{IN}$ is the input voltage to the resistor tuning network, $I_{OUT}$ is the output voltage of the resistor tuning network, where R1 is the resistance of the first resistor connected in parallel with the R-2R ladder network, R2 is the value of resistance of the R-2R ladder network, R3 is the value of resistance of the third resistor, and the letter b represents a tuning variable that represents a current switch position where the tuning variable b is equal to $2^n$ divided by a setting parameter, wherein the setting parameter varies between 1 and $2^n$ in unit increments where n is the total number of shunt-arms in said R-2R ladder network.

14. The method as claimed in claim 12 further comprising the step of:
    providing a tunable resistor in an electronic component on an integrated circuit chip wherein said tunable resistor comprises said resistor tuning network.

15. The method as claimed in claim 14 wherein said electronic component comprises one of: an RC filter, an oscillator and a delay cell.

16. The method as claimed in claim 13 further comprising the step of:
    tuning said transfer function of said resistor tuning network by a control signal, wherein said control signal is capable of selecting one of a plurality of said switch positions in said resistor ladder network of said resistor tuning network.

17. The method as claimed in claim 16 further comprising the step of:
    maintaining resistor ratios in said transfer function of said resistor tuning network when said control signal tunes said transfer function of said resistor tuning network.

18. The method as claimed in claim 12 further comprising the step of:
    tuning out capacitative and resistor variations when said control signal tunes said transfer function of said resistor tuning network.

19. The method as claimed in claim 12 further comprising the steps of:
    providing a tunable resistor in a master resistor tuning network, wherein said tunable resistor in said master resistor tuning network comprises said resistor tuning network;
    providing at least one control signal from said master resistor tuning network to a plurality of electronic components on an integrated circuit chip, wherein each electronic component of said plurality of electronic components comprises a resistor tuning network capable of using said at least one control signal to provide a tunable resistor within said electronic component.

20. The method as claimed in claim 19 wherein an electronic component of said plurality of electronic components comprises one of: an RC filter, an oscillator and a delay cell.

21. The method as claimed in claim 14 further comprising the step of:
    tuning all resistors on said integrated circuit that are capable of being tuned using said R-2R ladder network in said resistor tuning network.

22. The method as claimed in claim 12 further comprising the step of:

operating said resistor tuning network as a tunable resistor that provides variable output values of resistance of said tunable resistor that range from said value of resistance of said tunable resistor minus five percent of said value of resistance of said tunable resistor to said value of resistance of said tunable resistor plus five percent of said value of resistance of said tunable resistor.

* * * * *

UNITED STATES PATENT AND TRADEMARK OFFICE
CERTIFICATE OF CORRECTION

PATENT NO. : 6,937,179 B1 Page 1 of 1
DATED : August 30, 2005
INVENTOR(S) : Brian C. Martin It is certified that error appears in the above-identified patent and that said Letters Patent is hereby corrected as shown below:

<u>Column 2,</u>
Line 34, delete "2001" and replace with -- 200 --;

<u>Column 9,</u>
Equation 13, delete "$b=2_n$/setting" and replace with -- $b=2^n$/setting --.

Signed and Sealed this

Thirteenth Day of June, 2006

JON W. DUDAS
*Director of the United States Patent and Trademark Office*